United States Patent
Song et al.

(10) Patent No.: US 11,644,501 B2
(45) Date of Patent: May 9, 2023

(54) METHOD FOR IDENTIFYING PCB CORE-LAYER PROPERTIES

(71) Applicant: International Business Machines Corporation, Armonk, NY (US)

(72) Inventors: Tao Song, Shenzhen (CN); Zhongfeng Yang, Shenzhen (CN); XiYuan Yin, Guangzhou (CN); Xiao Hu, Shenzhen (CN); LiCen Mu, Shenzhen (CN); Mingman Li, Shenzhen (CN)

(73) Assignee: International Business Machines Corporation, Armonk, NY (US)

( * ) Notice: Subject to any disclaimer, the term of this patent is extended or adjusted under 35 U.S.C. 154(b) by 351 days.

(21) Appl. No.: 17/027,066

(22) Filed: Sep. 21, 2020

(65) Prior Publication Data

US 2022/0091181 A1   Mar. 24, 2022

(51) Int. Cl.
| | | |
|---|---|---|
| *G01R 31/28* | (2006.01) | |
| *G01R 31/304* | (2006.01) | |
| *H05K 1/11* | (2006.01) | |
| *H05K 1/02* | (2006.01) | |
| *H05K 3/00* | (2006.01) | |
| *H05K 3/42* | (2006.01) | |

(52) U.S. Cl.
CPC ..... *G01R 31/2813* (2013.01); *G01R 31/2818* (2013.01); *G01R 31/304* (2013.01); *H05K 1/0268* (2013.01); *H05K 1/115* (2013.01); *H05K 3/0047* (2013.01); *H05K 3/42* (2013.01); *H05K 2203/06* (2013.01); *H05K 2203/162* (2013.01)

(58) Field of Classification Search
CPC ............ G01R 31/2813; G01R 31/2818; G01R 31/304; G01R 31/2805; H05K 1/0268; H05K 1/115; H05K 3/0047; H05K 3/42; H05K 2203/06; H05K 2203/162; H05K 3/429; H05K 2201/09627

See application file for complete search history.

(56) References Cited

U.S. PATENT DOCUMENTS

| | | | |
|---|---|---|---|
| 5,010,449 A | | 4/1991 | Baldino |
| 5,701,667 A | * | 12/1997 | Birch ................. G01R 31/2805 |
| | | | 324/763.01 |

(Continued)

FOREIGN PATENT DOCUMENTS

| | | |
|---|---|---|
| CN | 104820849 A | 8/2015 |
| CN | 208819248 U | 5/2019 |

(Continued)

OTHER PUBLICATIONS

Jaglan et al., "Test Equipment and Methods—Test automation: PCBA Automated Testing Traceability and Fault Fracking (RFID) System," IPC India, Printed Sep. 18, 2020, 8 pages https://www.ipcindia.org.in/news/Technical_Papers/IPC%20India_TA_Oct_2019_Mr_Thaneshwar_Jaglan.pdf.

*Primary Examiner* — Alvaro E Fortich
*Assistant Examiner* — Zannatul Ferdous
(74) *Attorney, Agent, or Firm* — Peter J. Edwards (57) ABSTRACT

A reference via in a set of plated vias on a printed circuit board is located. A reference lead is applied to the reference via. A test via in the set of plated vias is located. A test lead is applied to the test via. An electrical conductance between the reference via and the test via is measured. A property of a core layer of the printed circuit board is identified based on the electrical conductance.

20 Claims, 8 Drawing Sheets

(56) References Cited

U.S. PATENT DOCUMENTS

| | | | | |
|---|---|---|---|---|
| 7,619,434 | B1* | 11/2009 | Lorenz | G01R 31/2818 324/763.01 |
| 7,676,920 | B2* | 3/2010 | Farkas | H05K 1/0268 29/830 |
| 2008/0217052 | A1* | 9/2008 | Matsui | H05K 1/115 174/266 |
| 2011/0308082 | A1 | 12/2011 | Chen | |
| 2014/0229783 | A1* | 8/2014 | Qin | H05K 1/0268 714/734 |
| 2019/0035593 | A1* | 1/2019 | Tsujino | H01J 35/045 |

FOREIGN PATENT DOCUMENTS

| | | |
|---|---|---|
| CN | 109933033 A | 6/2019 |
| CN | 209028662 U | 6/2019 |
| CN | 110008776 A | 7/2019 |
| CN | 110400152 A | 11/2019 |
| CN | 107992917 B | 1/2020 |
| WO | 2013017504 A1 | 2/2013 |

* cited by examiner

METHOD FOR IDENTIFYING PCB CORE-LAYER PROPERTIES

BACKGROUND

The present disclosure relates to printed circuit boards, and more specifically, to tracing the manufacturing properties of printed circuit boards.

Printed circuit boards are typically composed of several layers of copper foil that is attached to a substrate and etched in a pattern that forms wires on the substrate. These layers of foil and substrate are typically separated by an adhesive layer, such as a glass-resin mixture. The stacks of substrate, copper, and adhesive form the inner layered structure of the printed circuit board. Once the printed circuit board is completed, these inner layers become inaccessible through non-destructive means.

The typical manufacturing process for a printed circuit board involves the acquiring of raw materials that make up the printed circuit board, mixing pre-determined portions of those materials to create the core layers of the board, and several intricate processes for combining layers, etching copper, and removing unwanted byproducts. Throughout the lifecycle of a particular printed-circuit-board design, various aspects of the manufacturing process can change and be optimized.

SUMMARY

Some embodiments of the present disclosure can be illustrated as a method of identifying a property of a core layer of a printed circuit board. The method may comprise locating a reference via in a set of plated vias on the printed circuit board and applying a reference lead to the reference via. The method may also comprise locating a test via in the set of plated vias and applying a test lead to the test via. The method may also comprise measuring an electrical conductance between the reference via and the test via. The method may also comprise identifying the property of the core layer of the printed circuit board based on the electrical conductance.

Some embodiments of the present disclosure can also be illustrated as a printed circuit board. The printed circuit board may comprise a set of core layers. The printed circuit board may also comprise a set of reference vias. The printed circuit board may also comprise a set of core codes. Each core code in the set of core codes may correspond to a core layer in the set of core layers. Each core code may comprise a set of test vias. A pattern of electrical connections between the set of test vias in a particular core code and a particular reference via in the set of reference vias signifies a property of the particular core layer to which the particular core code corresponds.

Some embodiments of the present disclosure can also be illustrated as a method of making a printed circuit board. The method may comprise forming a first core layer and creating a reference location on the first core layer. The method may also comprise creating a test location on the first core layer and forming an electrical connection between the reference location and the test location. The method may also comprise laminating the printed circuit board. The method may also comprise drilling a reference via through the printed circuit board at the first reference location. The method may also comprise drilling a test via through the printed circuit board at the test location. The method may also comprise plating the reference via and the test via.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to printed circuit boards, and more specifically, to tracing the manufacturing properties of printed circuit boards. While the present disclosure is not necessarily limited to such applications, various aspects of the disclosure may be appreciated through a discussion of various examples using this context.

In printed-circuit-board manufacturing, it is not atypical for a large quantity of printed circuit boards (sometimes referred to herein as "PCBs") from a single PCB design to be manufactured over a long period. For example, for a model of an end user product in which a particular PCB design is incorporated, a pair of PCBs that are sold two corresponding products may be manufactured several months or even several years apart from each other. Over this long period of time, aspects of the process by which those PCBs are manufactured can change.

For example, sources of the raw materials that make up the different PCB layers and components may change, as may the mixture of those raw materials. As a more specific example, throughout the life cycle of the product, the vendor that provides the fiberglass for the PCB substrates may change, and the proportions of fiberglass and resin in the substrate layers may change as well. Further, the process by which the PCB is manufactured (e.g., the etching process or the lamination process) may be optimized as well. These changes may be referred to herein as changes to the "manufacturing properties" of a PCB, and they may sometimes have a large and unexpected effect on the function of the PCB.

The effects of the differing manufacturing properties on a PCB can sometimes cause a PCB with a certain combination of manufacturing properties to malfunction. When a large number of PCBs are not functioning as expected, identifying the manufacturing properties of those PCBs can not only help diagnose potential problems with the PCB that may be related to the manufacturing properties, but also help to locate other PCBs with similar manufacturing properties to be checked for defects. This may help both in diagnosing an issue with a group of PCBs, and also with locating PCBs with similar manufacturing properties for a product recall (potentially avoiding litigation related to the product malfunction).

For these reasons, an important part of the PCB manufacturing process is developing a system by which the manufacturing properties of a PCB can be tracked. For example, keeping track of when a particular PCB was manufactured can help to identify the manufacturing properties which with PCBs were being manufactured at that time. For relatively simple PCBs (e.g., single-layer PCBs), tracking manufacturing properties can be a manageable task. However, as the number of layers in a PCB increases, tracking the manufacturing properties of all the layers in a particular PCB can become challenging.

PCBs with multiple layers are typically composed of "core layers" stacked upon each other. Core layers (also referred to herein as "cores") typically take the form of an internal layer of material (e.g., a mixture of resin, glass, and laminate) that serves as a substrate on which metal wire (i.e., etched copper foil) is placed. Some PCBs feature core layers that have copper-wire layers adhered to both sides of the core, resulting in PCBs that have twice as many metal layers as core layers. Regardless, after the core layers of a PCB are formed, they are adhered together using with an adhesive layer such as "prepreg" (e.g., a mixture of resin and glass) to form the layers of the PCB.

Tracking the manufacturing properties of a PCB with many core layers can be challenging because the manufacturing properties for the PCB may change on a core-by-core basis during the lifecycle of the PCB. For example, a PCB laminated in year 1 may have sourced the materials for cores 1 and 2 from a certain vendor. On the other hand, while a PCB laminated in year 2 may have sourced its materials for core 1 from the same vendor, the PCB may have sourced the materials for core 2 from a different vendor. These differences may be due, in part, because the individual core layers are manufactured at different times.

For example, core layer 1 of a PCB may have been manufactured weeks or months before core layer 2 of the same PCB. Further, during this time, the manufacturing process of all the PCB cores may have changed. For example, a slightly different pressure or amount of heat may be applied to the stack of cores during lamination, or the copper foil for a particular core may be etched for slightly different amount of time. If one core of a PCB predates the corresponding changes, but another core does not, the cores of the PCB may differ slightly in their performance.

The compounding effects of PCBs being manufactured at different times, the manufacturing properties of a PCB design changing on a core-by-core basis, and the cores of a single PCB being formed at different times can cause the number of permutations of potential manufacturing properties for a single PCB to be extremely large. Further, it is not feasible to predict in advance which of those permutations may be related to future defects. Any combination of manufacturing properties could, in theory, cause a set of PCBs that share those manufacturing properties to function abnormally. Because the set of PCBs that share a particular combination of cores with a particular set of manufacturing properties often does not align perfectly with a "lot" of PCBs (e.g., a group of PCBs that were all manufactured at the same time and in the same location), tracking the manufacturing properties on a core-by-core basis, rather than a PCB basis, can be beneficial for future investigations of abnormal PCB behavior.

Unfortunately, it can be difficult to determine the manufacturing properties of an internal core layer after the PCB is assembled. PCB assembly involves a process known as lamination, in which the core layers of the PCB are stacked together and exposed to high heat and pressure, causing the resins within and between the core layers to soften, intermingle, and cure. Once this occurs, it is typically infeasible to determine the manufacturing properties of an internal core layer of the PCB, even when using destructive methods. Thus, information related to the internal core layers of a particular PCB can typically only be traced by reviewing the manufacturing records for the particular PCB. If accurate records are maintained for the PCB's lot code, some information related to the inner layers may be available. However, complete records regarding all inner core layers of a PCB through the PCB's lot codes can be very difficult to maintain due to the number of differences in the inner core layers of PCBs throughout the different lots. Thus, manufacturing properties for an inner core layer may need to be extrapolated or estimated.

Unfortunately, if a failure of a set of PCBs appears to be related to the properties of an inner core layer, identifying the manufacturing properties of that core layer can be very important. Extrapolation or estimation may not be necessary, given the potential value of properly identifying a cause of a failure. Thus, in some use cases, significant efforts are devoted to tracking and maintaining very precise records of the core-layer manufacturing properties of every PCB created. However, as previously discussed, these records can become extremely complicated due to the number of permutations of core-layer manufacturing properties in a PCB. This can make tracking the information and maintaining it very time consuming and costly.

For this reason, some PCB-manufacturing use cases attempt to attach x-ray watermarks to the inner core layers of the PCB. These x-ray watermarks can, in theory, be identified after PCB lamination by projecting x-ray radiation through the PCB and detecting the portions of the PCB that the x-rays did not pass through. However, these methods can also be expensive, due to the requirement that an x-ray machine be maintained for troubleshooting purposes, and that PCBs be shipped to that x-ray machine for investigation.

Embodiments of the present disclosure address some of the issues noted above by incorporating a metal "core code" on an inner core layer of the PCB that can be measured after lamination through plated vias. These plated vias are positioned to pass through particular portions of the core code locations, enabling the core code to be identified by measuring the electrical conductance properties between the vias that pass through the core code. These electrical conductance properties can then be expressed in a core lot code, which can be referenced to track the manufacturing properties of the core layer itself.

For example, a set of marks (e.g., copper circles) may be formed (e.g., etched) onto the core layer substrate. Copper traces may span the distance on the core substrate between some of these marks. Thus, an electrical conductance may be formed between the marks that are connected between these copper traces. The resulting pattern of electrical conductance between these marks could correspond to a core lot code for that particular core layer. This core lot code could be recorded and stored with a. record of the manufacturing properties of that core layer.

After the PCB is formed and laminated, the core code marks on the PCB would no longer be visible. However, by drilling and plating vias through those marks, the pattern of electrical conductance between the plated vias at the surface of the board would mirror the pattern of electrical conductance between the core code marks on the core-layer substrate. Thus, by measuring and recording a pattern of electrical conductance, or lack thereof, between the vias at the surface of the PCB, the pattern of electrical conductance of the core code on the inner layer can be determined. This pattern can then be used to identify the core lot code, from which the manufacturing properties can be retrieved.

In some embodiments of the present disclosure, this core code design can be applied to PCBs with multiple inner core layers by applying a different core code on each core-layer substrate. While the physical pattern of core code locations may be the same for each core code, traces could be formed between different locations for each layer, resulting in a different pattern of electrical conductance for each core code. In these embodiments, the manufacturing properties of each individual inner core layer of the PCB could be determined based on a measurement of the pattern of electrical conductance between the plated vias that pass through the core code for those individual layers.

In some embodiments of the present disclosure, one of the core code locations may be designated a "reference," and the plated via that passes through that location may be designated a "reference via." In some such embodiments, the core lot code may be determined by identifying which of the non-reference locations (also referred to herein as "test locations") or non-reference vias (also referred to herein as "test vias") are electrically connected to the reference via. In other words, the pattern of electrical conductance could be expressed by identifying which test vias conduct electricity through the reference via, and which do not. This could be determined by measuring an electrical conductance between the reference via and each of the individual test vias on the surface of the PCB.

For example, if a set of core-code locations consisted of one reference mark and four numbered test marks, a binary digit of the core lot code could be assigned to each test mark. If an electrical connection is detected between the reference location and a test location, a "1" could be placed in that test mark's digit. For example, in a core code with four test marks, an electrical conductance measured at test vias 2 and 3 could result in a core lot code of "0110."

In some embodiments, therefore, the number of test vias may determine the number of core lot codes available. For this reason, the core lot code of a particular core layer may be described in terms of a number of test marks on that core layer's substrate (or the number of test vias that pass through those test marks). A core code with 4 test marks, for example, could be referred to as a 4-bit core lot code. In a 4-bit core lot code, $2^4$ codes (i.e., 16 codes) would be available. A core code with 8 test vias, however, would result in an 8-bit lot code, providing $2^8$ (i.e., 256) potential codes.

Figure 1A:
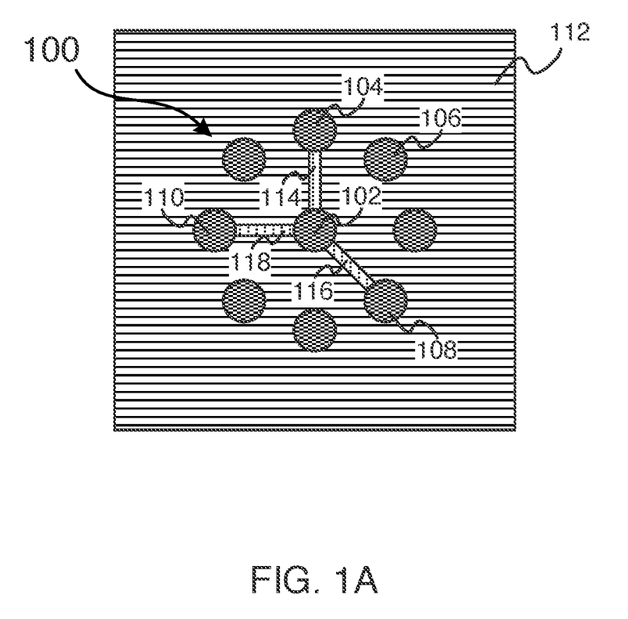
FIG. 1A depicts a first view of an 8-bit core code before the lamination process.

FIG. 1A depicts a first view of an 8-bit core code 100 before the lamination process. As depicted, core code 100 is composed of 9 core code locations. In FIG. 1A, these core code locations described as physical marks (e.g., etched metal circles), and are therefore also referred to as "marks." This is for the purpose of understanding. As is discussed herein, core code 100 could function if the 9 core code locations were not physically present in the PCB, but were created in a PCB design document.

The 9 core locations in core code 100 include reference mark 102 (also referred to herein as a "reference location") and test marks 104, 106, 108, and 110 (also referred to herein as "test locations"). Core code 100 has been formed on the substrate 112 of the core layer. Conductive metal traces 114, 116, and 118 have been formed between reference mark 102 and test marks 104, 108, and 118 respectively. Conductive metal traces 114, 116, and 118 are, in this example, of sufficient size and composition (e.g., copper) to create a measurable electrical conductivity between reference mark 102 and test marks 104, 108, and 118.

Because FIG. 1A illustrates core code 100 before lamination, core code 100 can be viewed naked eye, with optical cameras, a microscope, or some combination thereof. Thus, the conductive metal traces 114, 116, and 118 could be easily identified, and converted into a core lot code. For example, because core code 100 contains one reference mark 102 and 8 test marks, an 8-bit binary core lot code could be created to record the pattern of electrical conductance between the marks.

If, for example, test mark 104 is assigned the first digit in the core code, the measurable electrical conductance between reference mark 102 and test mark 104 could result in a "1" being placed in the first digit of the core code. For this reason, test mark 104 may be referred to as the "initial test mark" or the "initial test location." The remaining digits in the core lot code could correspond to the test marks in a specified order. For example, the remaining digits could correspond to the clockwise order of the test marks starting at the next mark, test mark 106. Because no measurable electrical conductance exists between reference mark 102 and test mark 106, a "0" could be placed in the second digit of the core lot code. By following this order, a "1" would also be placed corresponding to test marks 108 and 110, resulting in a core lot code of "10010010." The manufacturing properties that were used to manufacture the core layer corresponding to core code 100 (for example, the precise mixture of the resin and fiberglass used to make substrate 112 and the chemical process used to etch the copper traces on substrate 112) can then be associated with that core lot code, and further core layers that are made with those manufacturing properties could be assigned the same core lot code by forming the same electrical connections between core-code marks on the substrate of those core layers.

Of note, core code 100 is depicted with physical reference marks and test marks partially for the sake of understanding. Because conductive plated vias will be drilled in the PCB at the locations of reference mark 102 and the test marks, electrical connections will eventually be formed between those vias and conductive metal traces 114, 116, and 118, even if reference mark 102 and test marks 104, 108, and 110 do not physically exist. However, creating some physical marks on substrate 112 may facilitate recording the core lot code that represents the electrical conductance between vias and conductive metal traces 114, 116, and 118 with the naked eye or an optical camera. For example, ink could be applied at the locations of reference mark 102 and all test marks, enabling fast location and analysis of core code 100.

Figure 1B:
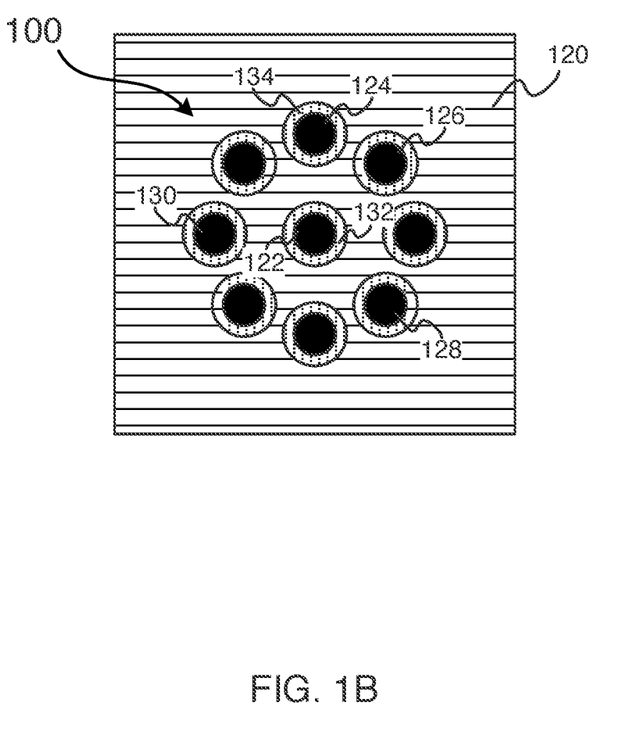
FIG. 1B depicts a second view of the 8-bit core code after the lamination process.

FIG. 1B depicts a second view of the 8-bit core code 100 after the lamination process has been completed. Specifically, core code 100 is now a part of PCB 120 into which vias have been drilled and plated to pass through the 9 metal circles of core code 100. For example, reference via 122 has been drilled such that it passes through reference mark 102. Similarly, test vias 124, 126, 128, and 130 have been drilled such that they pass through test marks 104, 106, 108, and 110 respectively.

Further, because reference via 122 and test vias 124, 126, 128, and 130 have been electroplated (represented here by their corresponding annular rings, such as annular rings 132 and 134), conductive metal traces 114, 116, and 118 should form electrical connections with the electroplating of reference via 122 and test vias 124, 126, 128, and 130. These electrical connections could be measured by attaching leads to the electroplating of the vias and determining whether a measurable electrical conductance exists between the vias. For example, a first lead to the electroplating of reference via 122 (for example, to annular ring 132) and a second lead to the electroplating of test via 124 (e.g., to annular ring 134) and determine whether a measurable electrical conductance exists between reference via 122 and test via 124. Upon detecting a measurable electrical conductance, a "1" could be placed in the digit of the core lot code that corresponds to test via 124. Because test via 124 corresponds to the initial test location (i.e., test mark 104), test via 124 would be the initial test via. Thus, in this example, this would result in the first digit of the core-lot code being populated with a "1" and the remaining digits being unknown (i.e., "1XXXXXXX"). However, by repositioning the second lead from test via 124 to test via 126, the lack of measurable electrical conductance between reference via 122 and test via 126 could be used to populate the second digit of the core lot code with a "0." In this example, this process could be continued in a clockwise fashion, detecting measurable electrical conductance between reference via 122 and test vias 128 and 130, resulting in the core lot code "10010010." By looking up this core lot code, the manufacturing properties of the core layer to which the core lot code corresponds could be identified.

As illustrated, the test vias of core code 100 all share a single reference via, resulting in a ratio of eight test vias to one reference via. However, various other combinations of test vias and reference vias may be utilized without straying from the embodiments of the present disclosure. For example, in some embodiments, fewer test vias may be included in a core code. This may result in a core lot code of fewer digits, but also reduce the amount of board space required for the core code. Thus, embodiments with fewer test vias may be beneficial, for example, in use cases in which PCB space is limited or in which fewer possible core-code combinations are expected. On the other hand, embodiments with more than eight test vias may be beneficial, for example, in use cases in which PCB space is not limited or in which many possible core-code combinations are expected.

Similarly, in some embodiments more than one reference via may be included in a core code. For example, in embodiments with many test vias (e.g., 16), wiring all the test vias to the same reference via (e.g., using conductive metal traces) may result in a very high wiring density for the core code. This high wiring density may result, for example, in shorts between the conductive metal traces of different test vias. Thus, in these examples, more reference vias may be included in a core code.

For example, if a core code included 32 test vias, the 32 test vias may be divided into four groups of eight test vias (or two groups of 16 test vias). Each of these groups may have a reference via dedicated to that group. Thus, if a core code with 32 test vias is divided into four groups of eight test vias, the electrical conductance patterns of the first group of test vias would be analyzed with respect to a first reference via, the electrical conductance patterns of the second group of test vias would be analyzed with respect to a second reference via, and so on.

This concept could be applied to various embodiments of the present disclosure to result in various combinations of test and reference vias. For example, in some extreme embodiments, every test via on the PCB may have its own dedicated reference via (i.e., there would be an equal amount of test vias and reference vias in the core codes). In these embodiments, the conductance pattern of a core code could be analyzed by applying a test lead to a first test via (e.g., the initial test via of the core code), applying a reference lead to a first reference via (i.e., the reference via that corresponds to that initial test via), recording the result, then moving the test lead to the next test via and the reference lead to the next reference via. In other extreme embodiments, a core code with as many a 64 test vias may all share one reference via.

As illustrated, the vias of core code 100 are arranged in a circular pattern, with reference via 122 being located in the center of the circle. This may, in some embodiments, facilitate the identification of the reference via of any core code, because the reference via could always be in the center. However, identifying the digit of a core lot code to which each test via corresponds (or even identifying the test via that corresponds to the first digit of the core code) may be difficult. Thus, in some embodiments, other techniques may be utilized to identify core codes and their components.

Figure 2A:
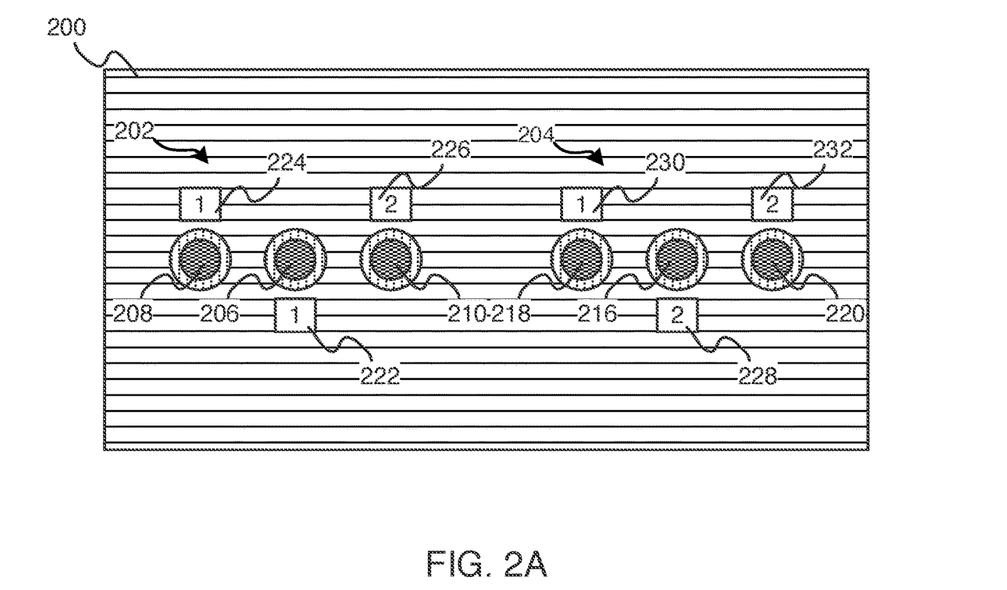
FIG. 2A depicts a pair of 2-bit core codes as viewed from the top of a printed circuit board.

FIG. 2A depicts a printed circuit board 200 (also referred to herein as "PCB 200") that contains a pair of labeled 2-bit core codes 202 and 204 as viewed from the top. Core codes 202 and 204 each correspond to a different inner core layer of PCB 200. Core code 202 contains a reference via 206 and two test vias 208 and 210. Similarly, core code 204 contains a reference via 216 and two test vias 218 and 220.

As illustrated, the top of PCB 200 contains labels that identify the core layers to which core codes 202 and 204 correspond, and also the digits of the core lot codes to which each test via 208, 210, 218 and 220 correspond. These labels may be, for example, silk screened onto the PCB for the sake of readability. Core label 222, for example, is located below reference via 206 and depicts a "1," which identifies the core layer to which core code 202 corresponds. In other words, a technician looking at PCB 200 could look at core label 222 and quickly determine that reference via 206 is the reference via for the first inner core layer of PCB 200. Further, digit labels 224 and 226 are located above test vias 208 and 210, and depict a "1" and "2" respectively. These numbers identify the digits of the core lot code to which test vias 208 and 210 correspond. In other words, a technician analyzing PCB 200 could look at digit labels 224 and 226 and quickly determine that test via 208 is the initial test via, and corresponds to the first digit of the core lot code and test via 210 corresponds to the second digit of the core lot code. Similarly, core label 228 identifies the core layer to which core code 204 corresponds, and digit labels 230 and 232 identify the core-lot-code digits to which test vias 218 and 220 correspond. Thus, a technician analyzing PCB 200 would be able to quickly and easily identify the components of core code 204 as well.

Figure 2B:
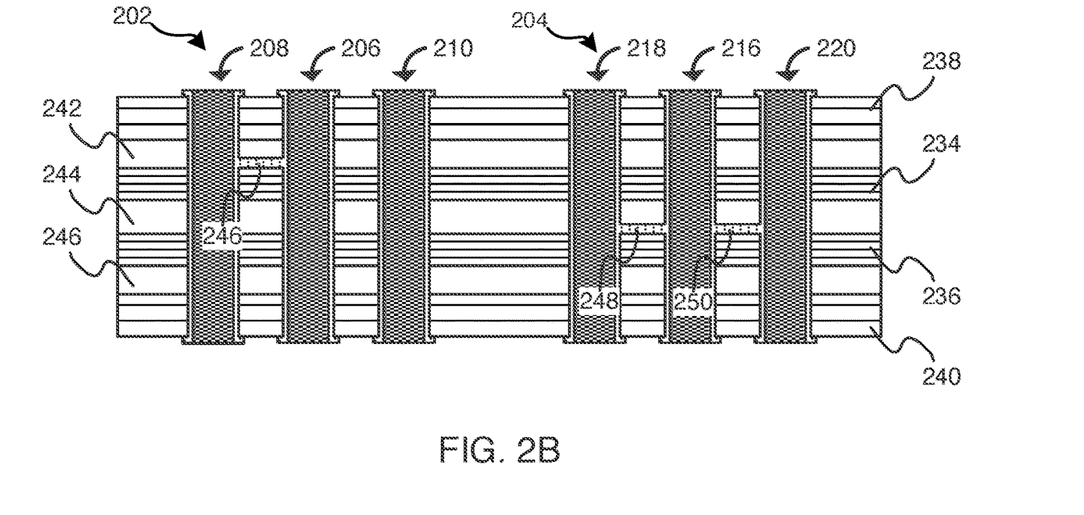
FIG. 2B depicts the pair of 2-bit core codes as viewed from a cross-section of the printed circuit board.

FIG. 2B depicts the pair of 2-bit core codes 202 and 204 as viewed from a cross-section of PCB 200. As illustrated, PCB 200 features two core layers 234 and 236 located between surface layers 238 and 240. Core layers 234 and 236 are attached to each other and to surface layers 238 and 240 by prepreg layers 242, 244, and 246.

Core layer 234, in this example, is the first core layer of PCB 200. As discussed in connection with FIG. 2A, core label 222 expresses that core code 202 corresponds to the first core layer, core layer 234, and that reference via 206 is the reference via of core code 202. Further, digit label 224 and 226 express that test via 208 corresponds to the first digit of core code 202's core lot code and test via 210 corresponds to the second digit.

FIG. 2B also illustrates conductive metal trace 246 attached to the substrate of core layer 234 and spanning the gap between the electroplating of reference via 206 and test via 208. Notably, no similar conductive metal trace exists between reference via 206 and test via 210. Thus, by applying a first lead to the electroplating of reference via 206 and a second lead to the electroplating of test via 208 and then test via 210, a technician could quickly determine the pattern of electrical conductance of core code 202. Specifically, a technician could detect a measurable electrical conductance between reference via 206 and test via 208 but no measurable electrical conductance between reference via 206 and test via 210. This would result in a core lot code of "10" for core layer 234.

Similarly, FIG. 2B illustrates conductive metal traces 248 and 250 attached to the substrate of core layer 236. Using the same techniques as discussed above, a technician could detect a measurable electrical conductance between reference via 216 and both of test vias 218 and 220. This would result in a core lot code of "11" for core layer 236.

As discussed in connection to FIGS. 1A and 1B, some embodiments of the present disclosure may utilize different combinations of test vias and reference vias in core codes. This discussion can be extended by applying the concept to the illustration depicted in FIGS. 2A and 2B. For example, in FIGS. 2A and 2B, each core code 202 and 204 includes a dedicated reference via (i.e., reference vias 206 and 216). However, in some embodiments of the present disclosure, core codes from different layers of a PCB could share the same reference via. For example, in FIG. 2A, reference via 206 could theoretically be located between test via 210 and test via 218, and may be located above or below the line of test vias 208, 210, 218, and 220. In this example, test vias 218 and 220 could be connected to reference via 206 as well as test via 208. This would avoid the need for reference via 216, but could complicate the metal wiring on core layers 234 and 236.

Figure 3:
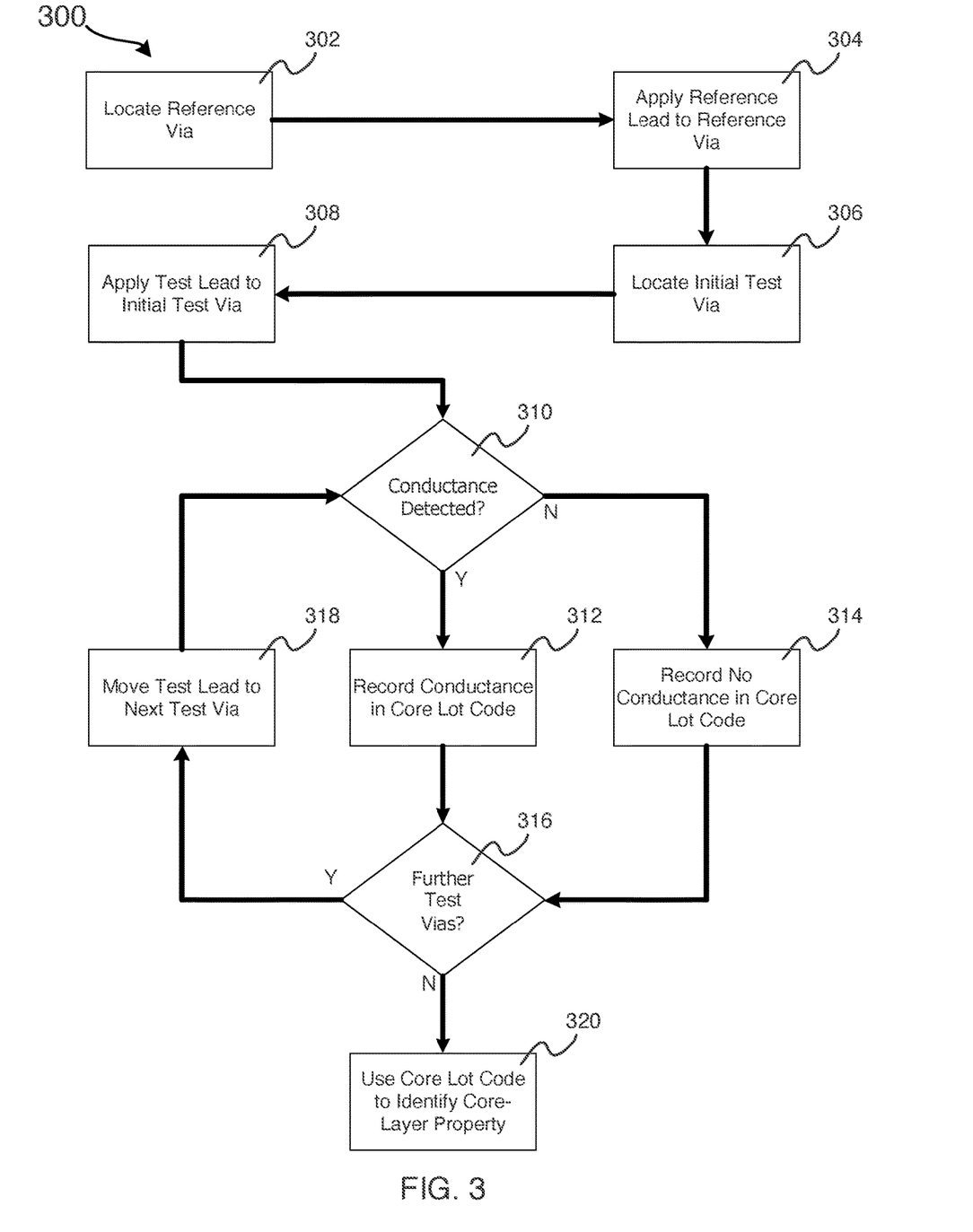
FIG. 3 depicts a method of reading a core code in accordance with the embodiments of the present disclosure.

For the sake of comprehension, FIG. 3 depicts a method 300 of reading a core code for a core layer in accordance with the embodiments of the present disclosure. Method 300 could be used, for example, to "translate" a core code into a core lot code in the examples illustrated in FIGS. 1B, 2A, 2B, and 4-6.

Method 300 begins in block 302, in which the reference via for the core code is located. As discussed previously, the method by which locating the reference via of a core code is located may depend on the implementation. For example, some reference vias may be located in a central portion of the vias that correspond to the core code, as shown in FIGS. 1B and 2A. Some reference vias may be labeled as such on the PCB surface, as shown in FIG. 2A. Some reference vias may require viewing PCB design files/schematics to identify. Some reference vias may be shaped differently than the test vias (for example, they may be larger or smaller), may have different shaped annular rings, or may be covered by a conductive body, such as a conductive copper pad or solder ball.

Once the reference via is located in block 302, a reference lead is applied to the reference via in block 304. This could take the form of, for example, inserting a lead into the via itself, placing a lead onto the annular ring surrounding the via, or applying a lead to a conductive pad that covers the reference via.

Method 300 also includes locating the initial test via in block 306. An initial test via, as referred to herein, is the test via that corresponds to the first digit in a core lot code for the core layer. For example, in a 4-bit core lot code, the presence of absence of a measurable electrical conductance between the reference via and the initial test via would determine the first digit of the 4-bit code. Similar to locating the reference via, locating the initial test via may occur in a variety of ways depending upon the implementation of the core code. For example, in some implementations, the initial test via may be larger than the other test vias, may be labeled with a silkscreen label on the core of the PCB, or may be covered with a copper pad.

Once the initial test via is located in block 306, a test lead is applied to the initial test via in block 308. Method 300 then includes a determination in block 310 of whether a measurable electrical conductance is detected between the reference via and the test via. For example, an electrical current could be applied to either the reference lead or the test lead. Measuring whether that current is propagated to the other lead would provide this determination. If an electrical conductance is detected in block 310, method 300 proceeds to block 312, in which the conductance is recorded in the core lot code. For example, if block 310 detects an electrical conductance between the reference via and the initial test via, block 312 could include inserting a "1" into the first digit of the core-lot code for the core layer. On the other hand, if an electrical conductance is not detected in block 310, the lack of conductance is recorded in block 314 in the core lot code by inserting a "0" into the core lot code.

Both blocks 312 and 314 proceed to block 316, which includes a determination of whether there are any further test vias in the core code that have not been tested for electrical conductance. If further test vias exist, method 300 includes proceeding to block 318, in which the test lead is moved from the current test via (e.g., the initial test via) to the next text via. In some embodiments, this "next" test via may be clearly marked (e.g., with a silkscreen label), may be adjacent to the current test via, or may be identifiable based on consulting design notes for the PCB. Once the test lead has been repositioned to the next test via, block 310, 312 or 314 (as appropriate) and 316 are repeated. If block 316 determines that no further test vias exist, method 300 proceeds to block 320, in which the core lot code can be used to identify one or more manufacturing properties of the corresponding core layer.

As discussed previously, some embodiments of the present disclosure may include a separate core code for each core layer of a PCB. This may beneficially enable the manufacturing properties of any core layer to be easily discovered after PCB lamination. However, as also discussed, part of analyzing a core code involves determining the core layer to which the core code corresponds, the reference via of the core code, and the initial test via of the core code. In some embodiments, some of this information may be tracked in design documents for the PCB, whereas other information may be apparent by viewing the core code on the surface of the PCB itself.

Figure 4:
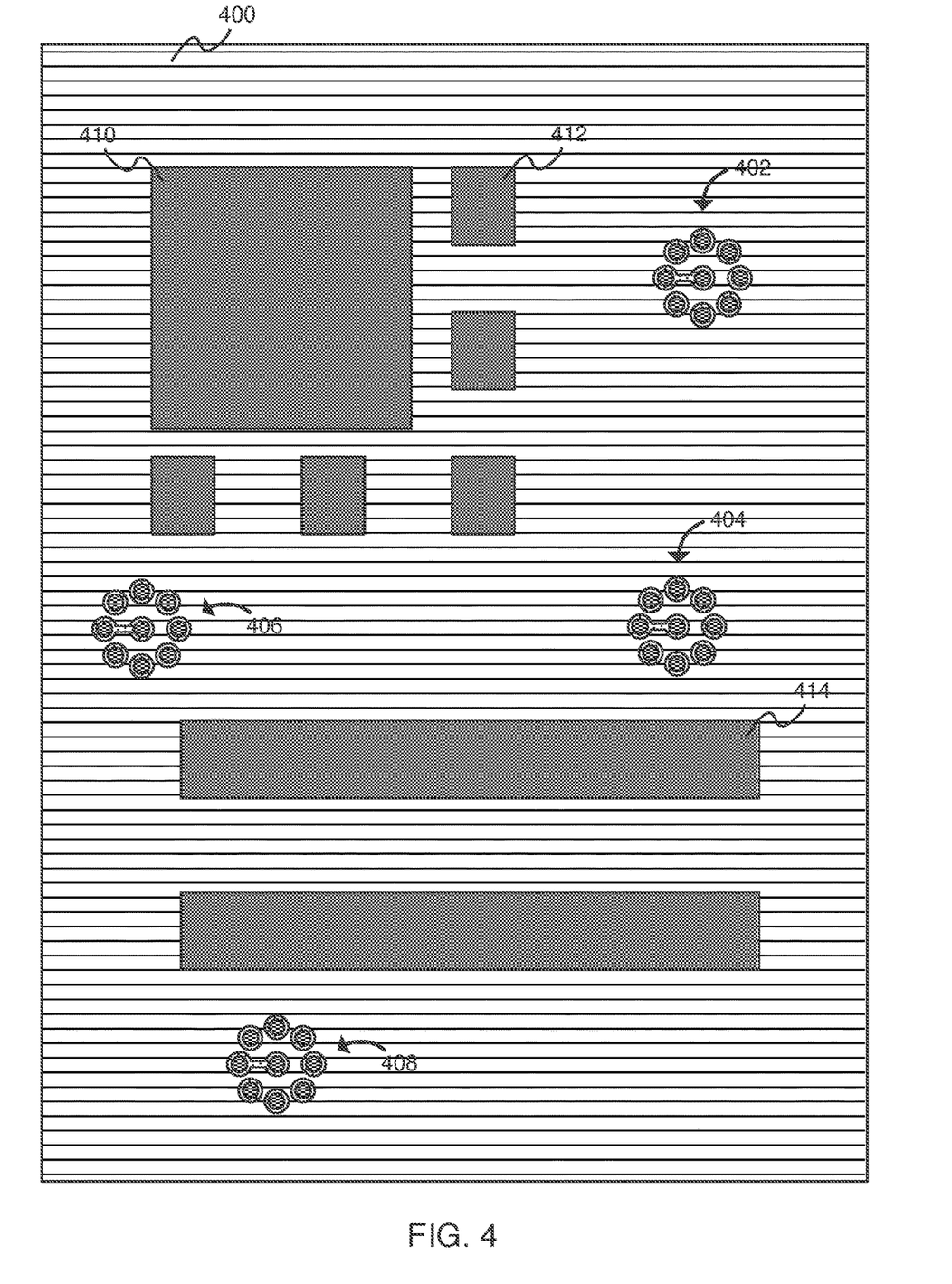
FIG. 4 depicts an example printed circuit board with a set of four core codes arranged according to the constraints of the printed-circuit-board design.

FIG. 4 depicts an example PCB 400 with a set of four core codes 402, 404, 406, and 408 arranged according to the constraints of the printed-circuit-board design. Each of core codes 402-408 may correspond to a separate inner core layer of PCB 400, as illustrated in FIGS. 2A and 2B. As depicted, the locations of core codes 402-408 do not exhibit a pattern that may be quickly useful for determining the core layers to which those core codes correspond. Rather, the locations of core codes 402-408 may be dictated by the internal board wiring and surface components (e.g., processor 410, memory die 412, and expansion slot 414).

Because the locations of core codes 402-408 do not correspond to a pattern, a technician viewing PCB 400 may be unable to quickly determine the inner core layer to which each core code corresponds. Thus, a technician may be required to review design documents or other records pertaining to PCB 400 to determine, for example, that core code 406 corresponds to core layer 1, core code 404 corresponds to core layer 2, core code 402 corresponds to core layer 3, and core code 408 corresponds to core layer 4.

As illustrated, core codes 402-408 are arranged in a circle of vias with one central via. The central via may be a reference via, which would make it easy for a technician to identify. Further, in the embodiment illustrated, the initial test via is also identified, which would also make it easy for a technician to determine where to start testing to determine the core lot code. While many methods of identify an initial test via are possible, in the embodiment illustrated a conductive metal trace between the reference via and the initial test via is also visible on the top surface of the board to identify the initial test via. This connection would likely be beneficial in that it would be quite obvious to a technician, but would have counterbalancing detriments in that it would cause the first digit of all core codes 402-408 to necessarily be "1." In other words, this method of labeling the initial test via would reduce the usable number of digits in the core lot code by 1.

Figure 5:
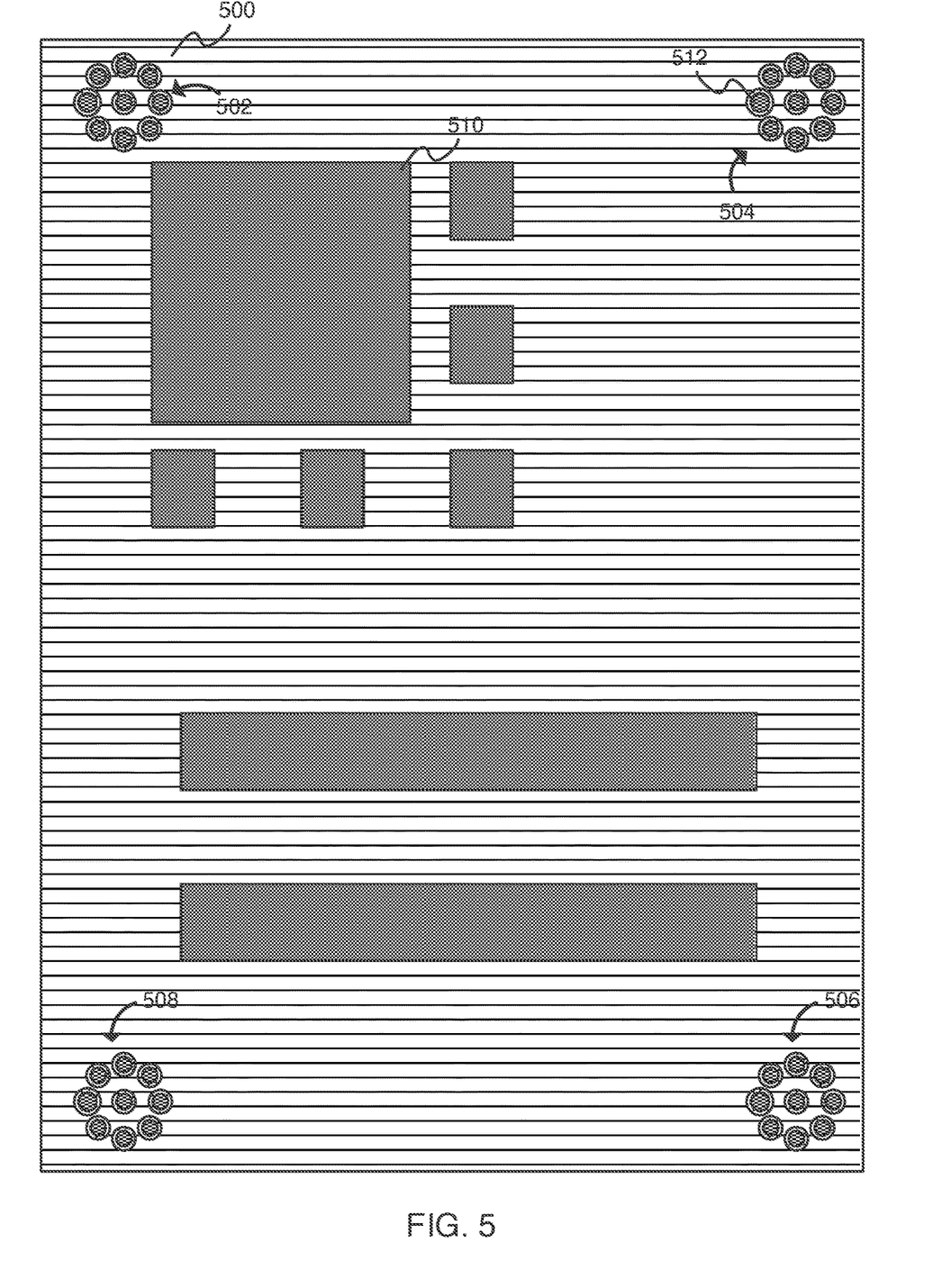
FIG. 5 depicts a printed circuit board with a set of four core codes arranged at the four corners of the printed circuit board.

FIG. 5 depicts a PCB 500 with a set of four core codes 502, 504, 506, and 508 arranged at the four corners of PCB 500. This purposeful arrangement may make it easier for a technician to determine the inner core layer to which each of core codes 502-508 corresponds than the embodiment disclosed in FIG. 4. For example, the technician may know that the core code that is closest to processor 510 is core layer 1, and the core codes "ascend" in core layers in a clockwise fashion. In other words, the technician would know that core code 502 corresponds to core layer 1, the next clockwise core code, core code 504, corresponds to core layer 2, and so on such that core code 506 corresponds to core layer 3 and core code 508 corresponds to core layer 4.

As illustrated, the vias of core codes 502-508 are organized into a circle, making it easy for a technician to quickly identify the center via as the reference via. Further, one of the test vias, the leftmost via (e.g., via 512), of each core code was drilled with a larger-diameter drill bit, and thus is larger than the other vias. Thus, by examining the core codes and identifying these outlier test vias, the technician would also be able to determine the initial test via that corresponds to the first digit in the core lot code for the corresponding core layer.

Figure 6:
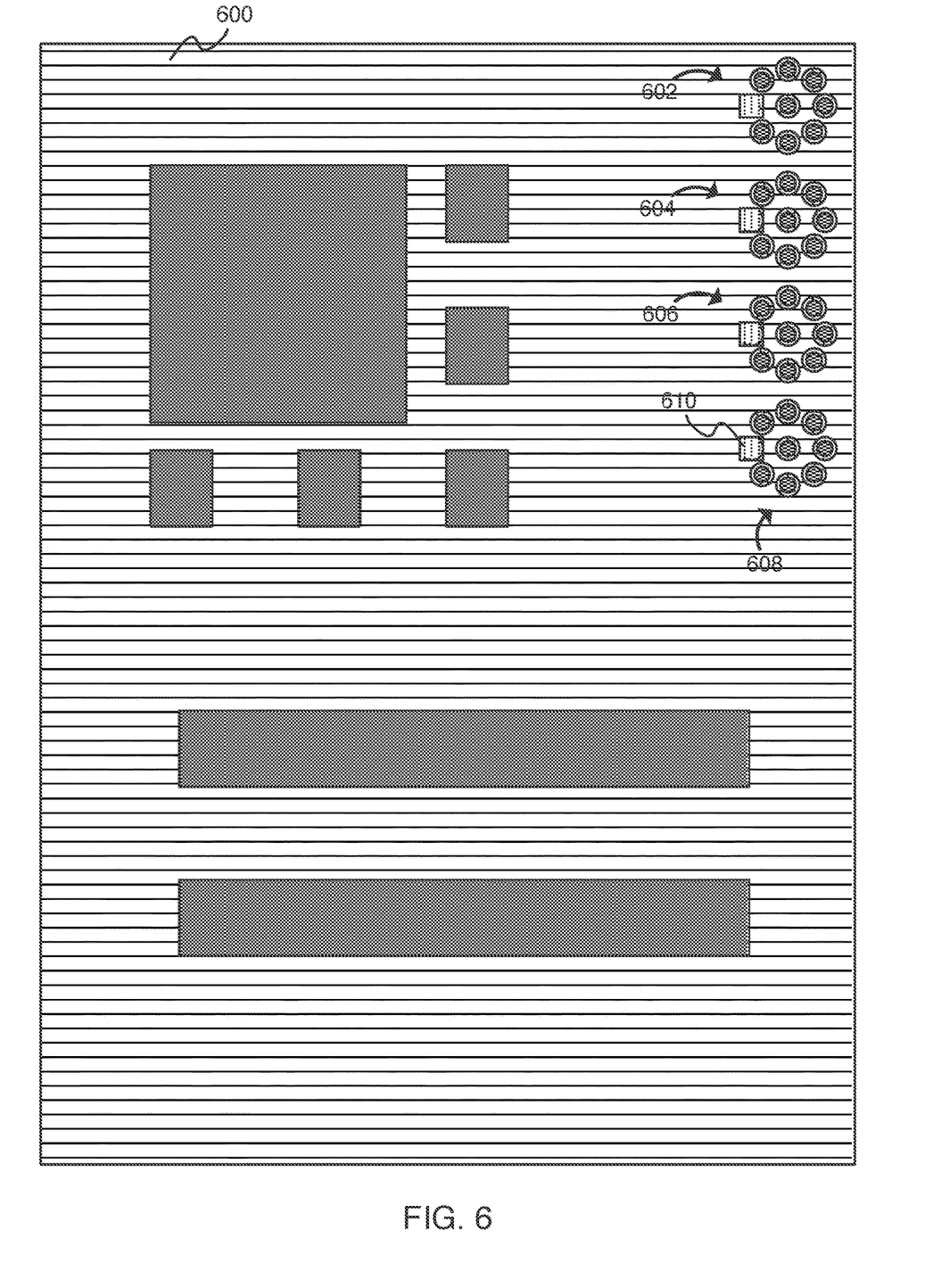
FIG. 6 depicts an example printed circuit board with a set of four core codes arranged in a line based on the order of the layers to which the core codes correspond.

FIG. 6 depicts an example PCB 600 with a set of four core codes 602, 604, 606, and 608 arranged in a line based on the order of the layers to which the core codes correspond. Similar to the arrangement of core codes 502-508 of FIG. 5, the purposeful arrangement of core codes 602-608 may make it very easy for a technician to determine the inner core layer to which each of core codes 602-608 corresponds. For example, the technician may know that the core code that is closest to the corner of the PCB is core layer 1, and that the core codes "ascend" in core layers in a line away from that core code. In other words, the technician would know that core code 602 corresponds to core layer 1, and that core codes 604, 606, and 608 correspond to core layers 2, 3, and 4 respectively because of the order in which those core codes appear in the line.

Similar to the vias of the core codes illustrated in FIGS. 1B, 4, and 5, the vias of core codes 602-608 are organized into a circle, which may make it easy for a technician to quickly identify the center via as the reference via. The initial test via of each of core codes 602-608 is covered with a conductive metal pad (e.g., conductive pad 610), enabling quick identification of the initial test via by a technician. Further, because these pads are conductive, a technician could test the conductance between the initial test vias and the corresponding reference vias by applying a lead to the conductive pad, rather than to the electroplating of the via itself. The technician could then test the remaining test vias in order (e.g., in a clockwise order) to identify the core lot codes for the corresponding layers.

Figure 7:
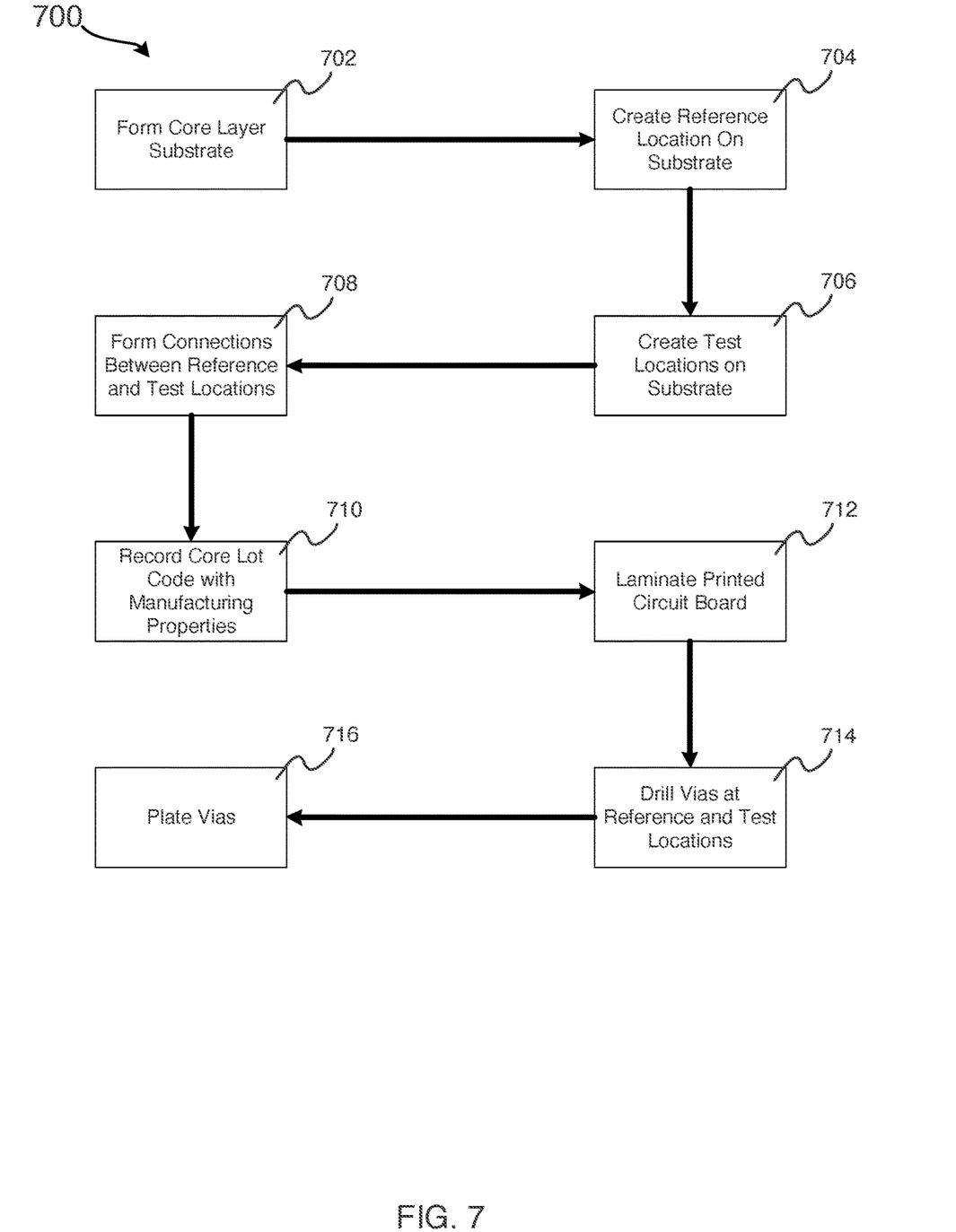
FIG. 7 depicts a method of manufacturing a printed circuit board with a core code, according to embodiments of the present disclosure.

For the ease of understanding, FIG. 7 depicts a method 700 of manufacturing a printed circuit board with a core code, according to embodiments of the present disclosure. It is of note that the process depicted by method 700 is very high level, and that, in reality, manufacturing a printed circuit board can be extremely varied and complex. However, these variations and complexities are beyond the scope of the present disclosure.

Method 700 begins at block 702, in which a core layer substrate for the PCB is formed. This may include obtaining a mixture of fiberglass and resin, for example, or mixing fiberglass and resin. The fiberglass and resin may then be heated to form a core substrate. In some embodiments, the core layer may be designed for metal traces (e.g., copper etched "wires") to be formed on one side, whereas in others the core layer may be designed for metal traces to be formed on both sides.

Method 700 also includes creating a reference location for a core code on the substrate in block 704. In some embodiments, this may take the form of etching a metal mark (e.g., a copper square or circle) in a location in which a reference via is intended to be drilled and plated. In some embodiments, no physical mark may be formed at the reference location, but rather the location may simply be "marked" in a PCB design document, so the location can be identified later when drilling the reference via.

Method 700 also includes creating the test locations for the core code on the substrate in block 706. In some embodiments, creating the test locations may take the same form that creating the reference location in block 704 did. In other words, if the reference location is created by etching a metal mark on the substrate, the test locations may also be created by etching a metal mark on the substrate. In some embodiments, however, the test locations could be created by another process. For example, a reference location could be created on a substrate in block 704 by etching a metal mark on the substrate, whereas the test locations could be created by "marking" the test locations in a PCB design document.

Method 700 also includes forming electrical connections between the reference location and the test locations in block

708. In typical PCB manufacturing, this process would involve applying a conductive metal foil (e.g., copper foil) to the substrate and etching the foil in a pattern that causes conductive metal traces to remain on the substrate between the reference location and some of the test locations. In some embodiments these connections may be formed between only between the reference location and the test locations that correspond to the digits in a core lot code that are intended to read "1." For example, to create a core lot code of "1001," block 708 would include forming connections between the reference location and the first and fourth test locations.

In some embodiments, blocks 704, 706, and 708 may all occur simultaneously. For example, if creating the reference location in block 704 and creating the test locations in block 708 both include etching a metal mark onto the board, etching those metal marks and the metal connections in block 708 may all occur as part of the same etching process. This may prevent the need for multiple etching processes for the core code. In some embodiments, blocks 704 and 706 may occur before block 708. For example, blocks 704 and 706 may be limited to recording (i.e., "marking") the reference and test locations in a design document for the PCB, in which case they would occur before the electrical connections are formed in block 708.

Once the electrical connections between the reference location and test locations are formed in block 708, the core lot code resulting from those connections (e.g., "1001" in the example above) is recorded and associated with the manufacturing properties of the core layer in block 710. This information may later be referred to if the board is being investigated after a malfunction, for example.

In some embodiments, recording the core lot code may include visually inspecting the core code (e.g., the conductive metal connections formed in block 708) before lamination. At this point, the conductive metal traces between the reference locations and test locations would likely be visible to the naked eye and would be visible to an optical camera. Thus, either a technician's eyesight or an optical camera could be used to view the traces, determine the test locations that are electrically connected to the reference location, and identify the core lot code accordingly.

Of note, in some embodiments not here pictured, a specific core code may be formed on the substrate due to the manufacturing properties of the core layer. For example, if several core layers have already been formed with the same manufacturing properties as the core layer in method 700, a core-lot code that corresponds to those manufacturing properties may already exist, and may already be recorded and associated with the manufacturing properties in a system that tracks PCB manufacturing. In this case, the specific core code may be formed on the substrate, but block 710 may be skipped because further recordation or association may be redundant. Alternatively, in these embodiments, rather than skipping block 710, block 710 may be altered to confirm that the core code was formed properly, and that it results in the correct core-lot code.

Method 700 also includes laminating the PCB in block 712. This may occur by processes discussed elsewhere in this disclosure, such as by stacking several core layers together with prepreg and exposing them to high pressure and temperature, causing the resins in the prepreg to fuse the layers together and cure. In some embodiments, each core layer that is laminated in block 712 may also have undergone blocks 702 through 710, resulting in each core layer including their own core codes.

After the PCB is laminated in block 714, the vias for the reference location and test locations are drilled, creating a reference via and set of test vias. As a result of block 714, non-plated holes should extend through the reference locations and test locations on the substrate, and the electrical traces formed in block 708 should either intersect with those vias or should intersect with a conductive metal mark that intersects with those vias. As a result, when the vias are electroplated in block 716, the connections formed in block 708 would be detectable through the electroplating of the vias (and any annular rings or conductive metal pads attached to those vias).

Of note, block 710 is illustrated in FIG. 7 as occurring before the lamination process. However, in some embodiments not pictured in FIG. 7, block 710 could occur later in the manufacturing process. For example, it may be possible to view the core code after lamination with the help of an X-ray machine, at which point the X-ray image of the core code could be used to identify the core-lot code in a similar fashion that an optical-camera image could be used before lamination. Further, after vias are drilled and plated, the core code could be identified by testing which test vias share a measurable electrical conductance with the reference via.

Once the vias are plated in block 716, a technician could apply leads to the reference vias and test vias to identify a pattern of electrical conductance for the core code as discussed herein (for example, by process 300). For example, in the example discussed earlier with the core lot code of "1001," a technician could apply a first lead to the reference via and a second lead to each of the four test vias in turn. This technician would detect a measurable electrical conductance between the reference lead and the first lead and the fourth lead, allowing the technician to identify the core lot code of "1001."

As discussed elsewhere in the disclosure, some embodiments may include printing useful information regarding the core codes on the surface of the PCB. For example, the reference via could be identified by a silkscreen label printed on the surface of the PCB. Similarly, the test vias, and the core layers to which each core code corresponds, could also be printed on the surface of the PCB. In some embodiments, method 700 could even include printing the core lot codes of one or more of the core codes on the surface of the PCB for easy identification.

Figure 8:
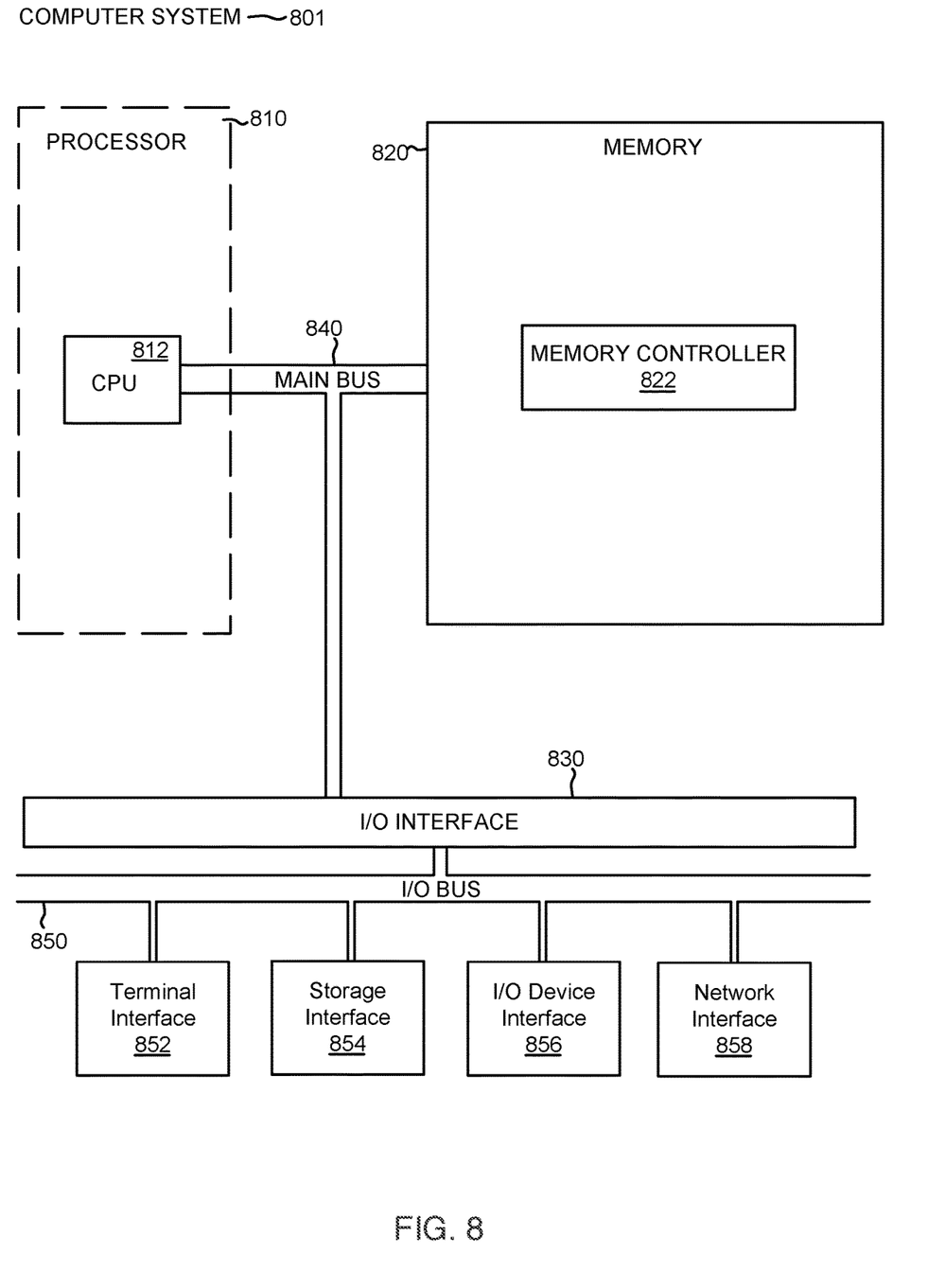
FIG. 8 depicts the representative major components of a computer system that may be used in accordance with embodiments.

FIG. 8 depicts the representative major components of an example Computer System 801 that may be used in accordance with embodiments of the present disclosure. The particular components depicted are presented for the purpose of example only and are not necessarily the only such variations. The Computer System 801 may include a Processor 810, Memory 820, an Input/Output Interface (also referred to herein as I/O or I/O Interface) 830, and a Main Bus 840. The Main Bus 840 may provide communication pathways for the other components of the Computer System 801. In some embodiments, the Main Bus 840 may connect to other components such as a specialized digital signal processor (not depicted).

The Processor 810 of the Computer System 801 may include one or more CPUs 812. The Processor 810 may additionally include one or more memory buffers or caches (not depicted) that provide temporary storage of instructions and data for the CPU 812. The CPU 812 may perform instructions on input provided from the caches or from the Memory 820 and output the result to caches or the Memory 820. The CPU 812 may include one or more circuits configured to perform one or methods consistent with embodiments of the present disclosure. In some embodiments, the Computer System 801 may contain multiple Processors 810 typical of a relatively large system. In other embodiments, however, the Computer System 801 may be a single processor with a singular CPU 812.

The Memory 820 of the Computer System 801 may include a Memory Controller 822 and one or more memory modules for temporarily or permanently storing data (not depicted). In some embodiments, the Memory 820 may include a random-access semiconductor memory, storage device, or storage medium (either volatile or non-volatile) for storing data and programs. The Memory Controller 822 may communicate with the Processor 810, facilitating storage and retrieval of information in the memory modules. The Memory Controller 822 may communicate with the I/O Interface 830, facilitating storage and retrieval of input or output in the memory modules. In some embodiments, the memory modules may be dual in-line memory modules.

The I/O Interface 830 may include an I/O Bus 850, a Terminal Interface 852, a Storage Interface 854, an I/O Device Interface 856, and a Network Interface 858. The I/O Interface 830 may connect the Main Bus 840 to the I/O Bus 850. The I/O Interface 830 may direct instructions and data from the Processor 810 and Memory 820 to the various interfaces of the I/O Bus 850. The I/O Interface 830 may also direct instructions and data from the various interfaces of the I/O Bus 850 to the Processor 810 and Memory 820. The various interfaces may include the Terminal Interface 852, the Storage Interface 854, the I/O Device Interface 856, and the Network Interface 858. In some embodiments, the various interfaces may include a subset of the aforementioned interfaces (e.g., an embedded computer system in an industrial application may not include the Terminal Interface 852 and the Storage Interface 854).

Logic modules throughout the Computer System 801 including but not limited to the Memory 820, the Processor 810, and the I/O Interface 830 may communicate failures and changes to one or more components to a hypervisor or operating system (not depicted). The hypervisor or the operating system may allocate the various resources available in the Computer System 801 and track the location of data in Memory 820 and of processes assigned to various CPUs 812. In embodiments that combine or rearrange elements, aspects of the logic modules' capabilities may be combined or redistributed. These variations would be apparent to one skilled in the art.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method comprising:
   locating a first reference via in a first set of plated vias on a printed circuit board;
   applying a reference lead to the first reference via;
   locating a first test via in the first set of plated vias;
   applying a test lead to the first test via;
   measuring a first electrical conductance between the first reference via and the first test via; and
   recording the first electrical conductance as a first value in a core lot code, wherein the core lot code reflects a first property of a first core layer of the printed circuit board.

2. The method of claim 1, further comprising:
   applying the test lead to a second test via in the set of plated vias; and
   measuring a second electrical conductance between the first reference via and the second test via.

3. The method of claim 2, further comprising:
   recording the second electrical conductance as a second value in the core lot code; and
   comparing the core lot code to a set of reference core lot codes.

4. The method of claim 1, further comprising:
   generating the core lot code; and
   printing the core lot code on the surface of the printed circuit board.

5. The method of claim 1, further comprising:
   applying the reference lead to a second reference via;
   applying the test lead to a second test via in the set of plated vias; and
   measuring a second electrical conductance between the second reference via and the second test via.

6. The method of claim 1, further comprising:
   locating a second reference via in a second set of plated vias on the printed circuit board;
   applying the reference lead to the second reference via;
   locating a second test via in the second set of plated vias;
   applying the test lead to the second test via;
   measuring a second electrical conductance between the second reference via and the second test via; and
   identifying a second property of a second core layer of the printed circuit board based on the second electrical conductance.

7. The method of claim 6, wherein the first reference via and the second reference via are the same via.

8. The method of claim 1, further comprising:
   locating a first reference location on the first core layer, wherein the first reference location corresponds to the first reference via;
   locating a first test location on the first core layer, wherein the first test location corresponds to the first reference via;
   detecting a conductive metal trace formed on the first layer between the first reference location and the first test location; and
   identifying the first property of the first core layer of the printed circuit board based on the detecting.

9. The method of claim 8, wherein the locating the first reference location, locating the first test location, and detecting occur prior to a lamination process.

10. The method of claim 8, wherein the locating the first reference location, locating the first test location, and detecting occur after a lamination process, and wherein the detecting comprises identifying an x-ray image of the conductive metal trace.

11. The method of claim 1, further comprising identifying the first test via as an "initial via".

12. A printed circuit board comprising:
    a set of core layers;
    a set of reference vias; and
    a set of core codes, wherein each core code corresponds to a core layer in the set of core layers, and wherein each core code comprises a set of test vias;
    wherein a pattern of electrical connections between the set of test vias in a particular core code and a particular reference via in the set of reference vias signifies a property of the particular core layer to which the particular core code corresponds.

13. The printed circuit board of claim 12, wherein the pattern of electrical connections for the particular core code is formed on the particular core layer.

14. The printed circuit board of claim 12, wherein the set of reference vias comprises a first reference via that corresponds to a first core code in the set of core codes, and wherein the set of reference vias comprises a second reference via that corresponds to a second core code in the set of core codes.

15. The printed circuit board of claim 12, wherein the particular reference via is located between the test vias in the set of test vias.

16. The printed circuit board of claim 12, wherein the set of test vias comprises an initial test via.

17. The printed circuit board of claim 16, wherein the initial test via is indicated on the surface of the printed circuit board.

18. The printed circuit board of claim 12, wherein a pattern of distribution of the set of core codes on the printed circuit board indicates the particular core layer to which each particular core code corresponds.

19. The printed circuit board of claim 12, wherein the property of the particular core layer is reflected in a core lot code on the surface of the printed circuit board.

20. A method of making a printed circuit board, comprising:
- forming a first core layer;
- creating a first reference location on the first core layer;
- creating a first test location on the first core layer;
- forming an electrical connection between the first reference location and the first test location;
- laminating the printed circuit board;
- drilling a first reference via through the printed circuit board at the first reference location;
- drilling a first test via through the printed circuit board at the first test location;
- plating the first reference via and the first test via; and
- generating a core lot code that corresponds to the electrical connection, wherein the core lot code reflects a first property of a first core layer of the printed circuit board.

* * * * *